United States Patent [19]
Rubinstein et al.

[11] 3,950,709
[45] Apr. 13, 1976

[54] AMPLIFIER FOR RANDOM ACCESS COMPUTER MEMORY

[75] Inventors: Richard B. Rubinstein, New York, N.Y.; Lamar T. Baker, Manhattan Beach, Calif.

[73] Assignee: General Instrument Corporation, Clifton, N.J.

[22] Filed: Oct. 1, 1974

[21] Appl. No.: 510,981

[52] U.S. Cl. .................. 330/35; 307/238; 330/18
[51] Int. Cl.² ............................................ H03F 3/42
[58] Field of Search ......... 307/205, 238; 330/18, 35

[56] References Cited
UNITED STATES PATENTS

| | | | |
|---|---|---|---|
| 3,644,904 | 2/1972 | Baker............................. | 307/238 X |
| 3,789,312 | 1/1974 | Heller et al..................... | 330/35 |
| 3,838,404 | 9/1974 | Heeren........................... | 340/173 R |

*Primary Examiner*—R. V. Rolinec
*Assistant Examiner*—Lawrence J. Dahl

[57] ABSTRACT

An integrated circuit ram amplifier includes a feedback loop which produces an output pulse before the output from the random access memory has completed its transition from full voltage to ground, thus increasing the computer's response time. The integrated circuit amplifier may find particular application in microprocessors (e.g. 8 bit word length, single bus two phase clock microprocessors).

3 Claims, 3 Drawing Figures

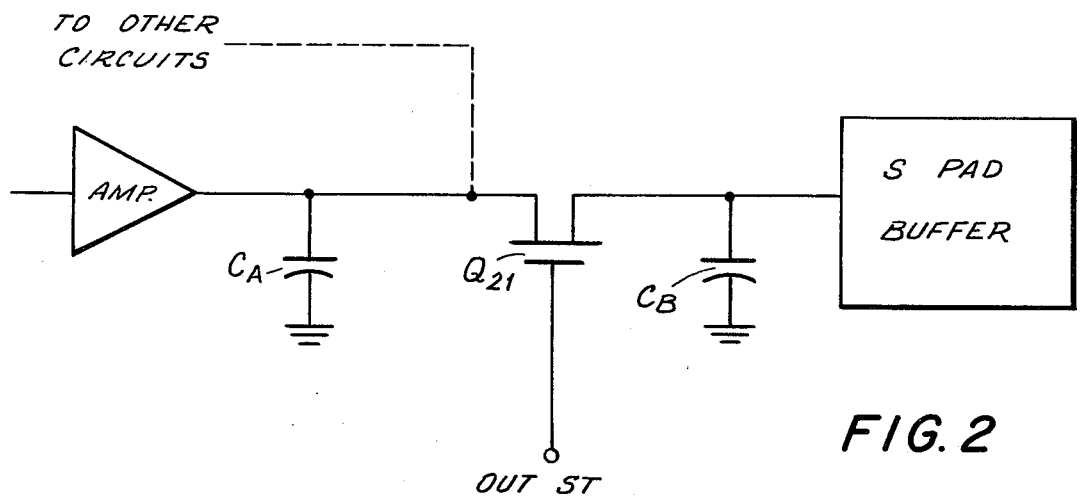
FIG. 2
FIG. 3
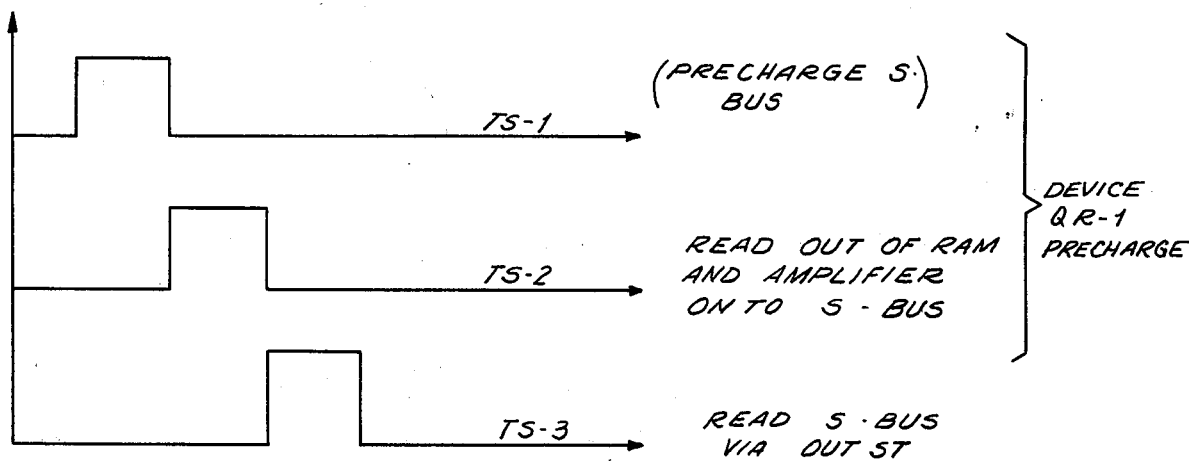

AMPLIFIER FOR RANDOM ACCESS COMPUTER MEMORY

BACKGROUND OF THE INVENTION

1. Field of the Invention

Broadly speaking, this invention relates to amplifiers. More particularly, in a preferred embodiment, this invention relates to an amplifier for use with a random access memory and which may advantageously be fabricated on an integrated circuit chip.

2. Discussion of the Prior Art

As is well known, in general purpose digital computers it is necessary to amplify the data output from the random access memory (RAM) before the data is applied to the main computer bus. Because of the poor response time inherent in prior-art RAM amplifiers it has heretofore been necessary to reduce the rate at which data is read-out from the RAM into the computer bus, thus slowing the overall operation of the computer.

SUMMARY OF THE INVENTION

The problem to be solved, then, is the provision of a high-speed RAM amplifier which is suitable for fabrication on an integrated circuit chip and which does not limit the rate at which data may be read-out of the memory.

These, and other problems, have been solved by the instant invention which comprises first and second semiconductor devices serially connected between a source of potential and ground; a third semiconductor device serially connected between said source of potential and the juncture of said first and second devices; a fourth semiconductor device serially connected between said source of potential and the gate electrode of said third semiconductor device; a fifth semiconductor device serially connected between the gate of said third semiconductor device and ground; means for supplying a first potential to the gate of said first, second and fourth semiconductor devices to cause the potential on the source electrode of said first semiconductor device to fall towards ground; means for connecting the potential on the source electrode of said first semiconductor device to the gate electrode of said fifth semiconductor device whereupon, as said source potential falls towards ground, the potential on the gate electrode of said third semiconductor device rises towards the supply potential turning the third semiconductor device on and producing an additional current flow through said second semiconductor device; means, connected to the gate electrode of said first, second and fourth semiconductor devices, for supplying a second, negative-going potential to cause the potential on the gate electrode of said fifth semiconductor device to rise; and a sixth semiconductor device connected between said supply potential and ground and having its gate electrode connected to the gate electrode of said fifth semiconductor device, whereby said sixth device produces an amplified version of said second, negative-going potential prior to said second potential reaching its minimum value.

The invention and its mode of operation will be more fully understood from the following detailed description when taken with the following drawings in which:

DESCRIPTION OF THE DRAWING

FIG. 2 depicts how the amplifier shown in FIG. 1 interfaces with other components of the computer; and FIG. 3 is a timing diagram useful in understanding the principles of the invention.

DETAILED DESCRIPTION OF THE INVENTION

Figure 1:
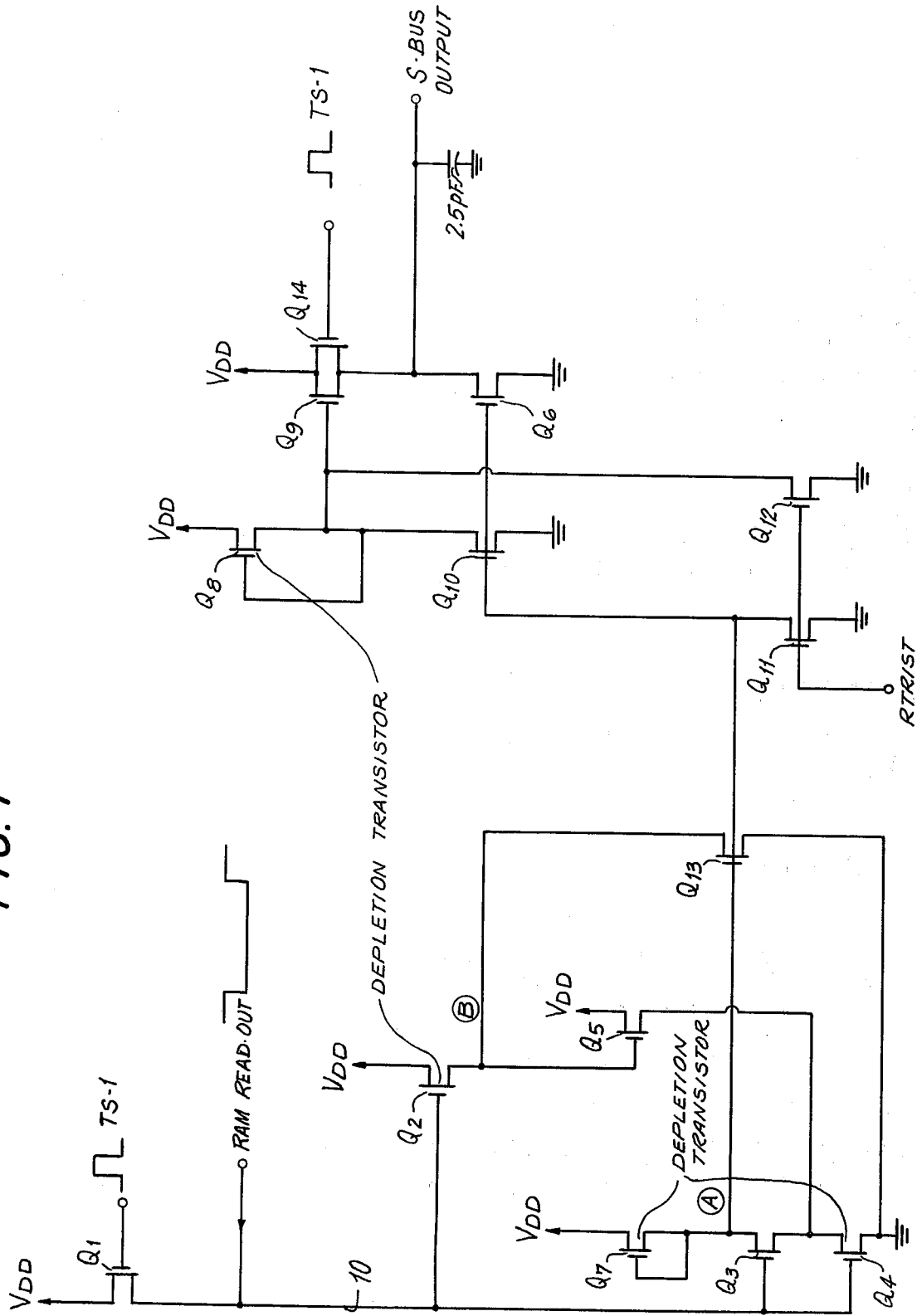
FIG. 1 is a schematic drawing of an illustrative amplifier according to the invention.

As shown in FIG. 1, the illustrative embodiment of the invention comprises a plurality of directly interconnected, semi-conductor devices, for example field effect metal oxide semiconductive devices (MOSFETS), or the like. The direct interconnection of the devices, without the use of any external, discrete components, renders the invention particularly advantageous for large scale integrated circuit (LSI) manufacture.

The interconnection of the various electrodes of the MOS devices is self-evident from the drawing and will not be repeated verbally. Rather, the circuit and its mode of operation will be described functionally, in a logical order.

The application of a positive-going pulse in time slot TS-1 (See FIG. 3) to the gate of transistor Q1 will precharge the gate electrode of transistors Q2, Q3 and Q4, via the lead 10. The positive potential applied to the gates of Q2, Q3 and Q4 will cause the potential present at node A to fall to less than one threshold drop which, in turn, permits node B to charge towards the supply voltage VDD, through transistor Q2.

The positive potential on node B permits transistor Q5 to turn-on and provides an additional current drain through transistor Q4, already conducting because of the precharge pulse in time slot TS-1 on conductor 10.

Assume that the readout pulse from the RAM is also applied to conductor 10 and it is negative-going. The positive pre-charge potential previously on conductor 10 will shift towards ground, however, it will be noted that less than a complete discharge of the RAM readout bus is necessary to allow node A to rise above the threshold voltage of transistor Q6, which in turn permits the S-bus output to fall towards ground potential. As the voltage on node A continues to rise, i.e. to become positive, the bleeder current through transistor Q7 still tends to be substantial, at least until a major change occurs in the potential of node A.

Transient analysis performed on an experimental version of the circuitry shown in FIG. 1 indicates that the S-bus output will charge towards ground in from 80 to 90 nano-seconds into time-slot TS-2 (See FIG. 3). This is an important result because the potential on the RAM Read-Out bus did not reach a threshold level until approximately 70 nano-seconds into TS-2 time.

FIG. 2 shows the operating environment for the circuit shown in FIG. 1. As shown, the output of the amplifier is connected to the source electrode of a MOSFET transistor Q21 whose drain electrode is connected to the S Pad Buffer of the computer.

The gate of transistor Q21 is connected to the outstart bus OUTST and provides the means by which signals from the RAM are fed to the S Pad Buffer.

The unavoidable stray capacitances $C_A$ and $C_B$ shown associated with the S Bus and the S Pad Buffer have heretofore been responsible for undesirable effects because of the resulting voltage drop caused by the capacitive voltage divider formed by $C_A$ and $C_B$. More specifically, the voltage VIN at the input to the S-Pad Buffer is not VOUT, the output of the S Bus, but only $$VIN = VOUT \times \frac{C_B}{C_A + C_B} \quad (1)$$

The low voltage at the input to the S Pad Buffer makes the operation of the output pad amplifier marginal. It is for this reason that the instant RAM amplifier includes an output network. Returning to FIG. 1, transistor Q8 precharges the gate of transistor Q9 to a potential which approaches that of the supply potential VDD during a time interval equal to TS-1 plus TS-2. This in turn, will provide an additional positive potential on the S-Bus over and above what is provided by transistor Q6 during time interval TS-1. Note that a positive potential is applied to the bus RTRIST at beginning of time interval TS-1 (FIG. 3). Thus, by the end of that interval the amplifier is effectively disconnected from the S Bus. Note also that the pulse in time-slot TS-1 is also applied to the gate of transistor Q14. Thus, the feedback path including nodes A and B permits the high speed read-out (on the S Bus) of an input signal (on the RAM read-out bus) before the negative going RAM signal has fully reached the ground level. This, in turn, permits the CPU of the computer to operate at a higher rate, than would otherwise have been possible.

One skilled in the art may make various changes and substitutions to the arrangement of parts shown without departing from the spirit and scope of the invention.

What is claimed is:

1. A high-speed amplifier, which comprises:
   first (Q3) and second (Q4) semiconductor devices each having a gate, a source and a drain; serially connected via their sources and drains between a source of potential (VDD) and ground;
   a third semiconductor device (Q5) having a gate, a source and a drain and with said source and drain serially connected between said source of potential and the juncture of said first and second devices;
   a fourth semiconductor device (Q2) having a gate, a source and a drain and with said source and drain serially connected between said source of potential and the gate of said third semiconductor device;
   a fifth semiconductor device (Q13) having a gate, a source and a drain and with said source and drain serially connected between the gate of said third semiconductor device and ground;
   means for supplying a first potential to the gate of said first, second and fourth semiconductor devices to cause the potential on the source of said first semiconductor device to fall towards ground;
   means for connecting the potential on the source of said first semiconductor device to the gate of said fifth semiconductor device whereupon, as said potential falls towards ground, the potential on the gate of said third semiconductor device rises towards the supply potential (VDD) turning the third semiconductor device on and producing an additional current flow through second semiconductor device;
   means, connected to the gate of said first, second and fourth semiconductor devices, for supplying a second, negative-going potential to cause the potential on the gate of said fifth semiconductor device to rise; and
   a sixth semiconductor device (Q6) having a gate, a source and a drain and with said source and drain connected between said supply potential and ground and having its gate connected to the gate of said fifth semiconductor device, whereby said sixth device produces an amplified version of said second, negative-going potential prior to said second potential reaching its minimum value.

2. The apparatus according to claim 1 further comprising:
   a seventh (Q9) and an eighth (Q14) semiconductor device each having a gate, a source, and a drain, connected in parallel with said sources and drains joined, the parallel combination being serially interposed between the supply potential and said sixth semiconductor device;
   means for supplying said first potential to the gate of said eighth semiconductor device; and
   means for supplying a third potential to the gate of said seventh semiconductor device whereby the amplified version of the second potential produced by said sixth device is augmented.

3. The apparatus according to claim 2 further comprising means for disabling said amplifier during a second time interval.

* * * * *